United States Patent
Fujisawa et al.

(10) Patent No.: US 8,537,626 B2
(45) Date of Patent: Sep. 17, 2013

(54) SEMICONDUCTOR DEVICE AND METHOD OF CONTROLLING THE SAME

(75) Inventors: Hiroki Fujisawa, Tokyo (JP); Kazuhisa Ureshino, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 135 days.

(21) Appl. No.: 13/317,595

(22) Filed: Oct. 24, 2011

(65) Prior Publication Data

US 2012/0134222 A1    May 31, 2012

(30) Foreign Application Priority Data

Nov. 26, 2010 (JP) ................. 2010-264148

(51) Int. Cl.
*G11C 7/00* (2006.01)

(52) U.S. Cl.
USPC ............................ 365/194; 365/191; 365/193

(58) Field of Classification Search
USPC ................. 365/194, 191, 193, 233.1, 189.05, 365/189.08, 230.06, 189.07, 230.03
See application file for complete search history.

(56) References Cited

U.S. PATENT DOCUMENTS

| 6,288,947 B1 * | 9/2001 | Kim et al. ................ 365/189.05 |
| 6,862,237 B2 | 3/2005 | Kato |
| 7,554,864 B2 * | 6/2009 | Park ............................ 365/193 |
| 2003/0123298 A1 | 7/2003 | Kato |

FOREIGN PATENT DOCUMENTS

| JP | 11-297650 A | 10/1999 |
| JP | 2003-196977 A | 7/2003 |
| JP | 2010-146675 A | 7/2010 |

* cited by examiner

*Primary Examiner* — Dang Nguyen
(74) *Attorney, Agent, or Firm* — McGinn IP Law Group, PLLC

(57) ABSTRACT

A semiconductor device includes a data input/output circuit connected to the memory cell array via a sense circuit, and an access control circuit that controls access to the memory cell array. The access control circuit includes: a first signal unit outputting a first signal for activating or inactivating a word line; a second signal unit outputting a second signal for activating or inactivating a bit line and the sense circuit; a third signal unit outputting a third signal for starting or stopping a supply of an overdrive voltage to the sense circuit; and a fourth signal unit outputting a fourth signal for inactivating the word line. The period during which the third signal remains activated is determined in accordance with the magnitude of an external voltage. In the fourth signal unit, the timing to generate the fourth signal is determined independently of the magnitude of the external voltage.

22 Claims, 11 Drawing Sheets

SEMICONDUCTOR DEVICE AND METHOD OF CONTROLLING THE SAME

BACKGROUND OF THE INVENTION

1. Field of the Invention

The present invention relates to a semiconductor device and a method of controlling the semiconductor device, and more particularly, to a semiconductor device that reads data by using sense amplifiers, and a method of controlling the semiconductor device.

2. Description of Related Art

A DRAM (Dynamic Random Access Memory) as an example of a semiconductor device stores data through charges stored in memory cells. The memory cells are placed at the intersection points between word lines and bit lines. The data reading operation in such a DRAM is performed as follows. First, a word line is activated. The memory cells connected to the activated word line are electrically connected to the bit lines. The potentials of the bit lines are slightly changed by the electric charges (data) stored in the memory cells. The sense amplifiers connected to the bit lines are then activated, to amplify the potential difference between each pair of bit lines. After that, the bit lines are electrically connected to a data input/output circuit via column switches. Through the potentials amplified by the sense amplifiers, the data input/output circuit recognizes the existence of electric charges stored in the memory cells or the 1-bit data stored in each memory cell. After that, the word line is inactivated. Hereinafter, the period from inactivation of an activated word line to activation of another word line will be referred to as a "unit time" or a "cycle time."

Most of the internal circuits in a DRAM are normally driven by an internal voltage that is stabilized by lowering an external voltage supplied from outside. The internal voltage is substantially fixed, regardless of fluctuations of the external voltage. According to Japanese Patent Application Laid-Open Nos. 2003-196977 and 2010-146675, the active timeout period indicating the period from activation of a word line and activation of sense amplifiers to resetting of the word line varies between an external access mode and a refresh mode. Japanese Patent Application Laid-Open No. 11-297650 discloses a method of controlling overdriving in a circuit that generates signals for activation and inactivation of word lines and sense amplifiers. The signal generating circuit includes circuits that operate at an internal voltage and circuits that operate at an external voltage.

To shorten the unit time, the sensitivity of the sense amplifiers needs to be increased, and the period of time required for amplifying a very small voltage to a predetermined value needs to be shortened.

Therefore, when sense amplifiers are activated, an external voltage higher than an internal voltage is temporarily supplied to the high-potential side of each sense amplifier. In this manner, the sense amplifiers are overdriven, and the sensitivity of the sense amplifiers is increased. After that, the control circuit for the sense amplifiers inactivates the overdriving, and the sense nodes of the sense amplifiers almost reach the internal voltage at the end. The overdrive period (or the end of the overdrive time) greatly affects the period of time required by the bit lines to reach a predetermined potential. The active timeout period for inactivating a word line under the condition that the bit lines reach a potential that is 98% of the internal voltage also relates with the end of the overdrive time. The timing to inactivate a word line is normally determined by the control circuit that defines the overdrive time. The external voltage is higher than the internal voltage, but is not as stable as the internal voltage. Therefore, when the external voltage is high, the overdrive period is set relatively short, and when the external voltage is low, the overdrive period is set relatively long. In this manner, stable overdriving can be performed. The external voltage is supplied to the control circuit that defines the overdrive period, and the control circuit outputs a signal indicating the period of time that varies with fluctuations of the external voltage.

The trigger of inactivation of a word line is based on the overdrive period. However, if the overdrive period varies with the external voltage, the effective length of the unit time or cycle time (the actual value of the unit time) greatly depends on the external voltage. As a result, the unit time to be secured is not easily estimated. Specifically, the unit time is determined based on the semiconductor device and the controller that controls the semiconductor device. When the external voltage is particularly low, the actual value of the unit time may be too short with respect to a specified value. This matter becomes particularly conspicuous when "units time" are repeatedly set in response to refresh commands from outside.

SUMMARY

In one embodiment, there is provided a semiconductor device that includes a memory cell connected to a word line and a bit line; a sense amplifier circuit connected to the bit line; an access control circuit that controls the word line and the sense amplifier circuit; and an internal voltage generating circuit that generates an internal voltage stabilized regardless of fluctuations of an external voltage, wherein the access control circuit comprises: a first signal generator that operates on the internal voltage and generates a first signal that activates and inactivates the word line; a second signal generator that operates on the internal voltage and generates a second signal that activates and inactivates the sense amplifier circuit in synchronization with an activation and an inactivation of the word line; a third signal generator that operates on the external voltage and generates a third signal that starts and stops a supply of an overdrive voltage to the sense amplifier circuit in synchronization with the activation of the word line or an activation of the sense amplifier circuit; and a fourth signal generator that operates on the internal voltage and generates a fourth signal that inactivates the first signal in synchronization with the activation of the word line or the activation of the sense amplifier circuit, the third signal generator determining a period during which the overdrive voltage is to be supplied, in accordance with a level of the external voltage, and the fourth signal generator determining timing to activate the fourth signal in accordance with a level of the internal voltage, regardless of the level of the external voltage.

In another embodiment, there is provided a method of controlling a semiconductor device that includes the following steps: activating a first signal to activate a word line connected to a memory cell; activating a second signal to activate a sense amplifier that amplify information stored in the memory cell, the second signal being activated at a first delay time after activating the first signal; activating a third signal to start a supply of an overdrive voltage to a high-potential power supply node of the sense amplifier, the third signal being activated at the first delay time after activating the first signal; inactivating the third signal at a second delay time after activating one of the first and second signals; and activating a fourth signal to inactivate the word line, the fourth signal being activated at a third delay time after activating one of the first and second signals, wherein a first period from an activation of the third signal to an inactivation of the third signal depends on a level of an external voltage supplied to the semiconductor device, and the first delay time and the third delay time depend on an internal voltage not depending on the external voltage, the first delay time and the third delay time being independent of the external voltage, the first delay time and the third delay time not varying with fluctuations of the first period.

BRIEF DESCRIPTION OF THE DRAWINGS

The above and other features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings. It will be understood that what is claimed by the present invention is not limited to such a technical concept and is set forth in the claims of the present invention.

(Concept)

Figure 1:
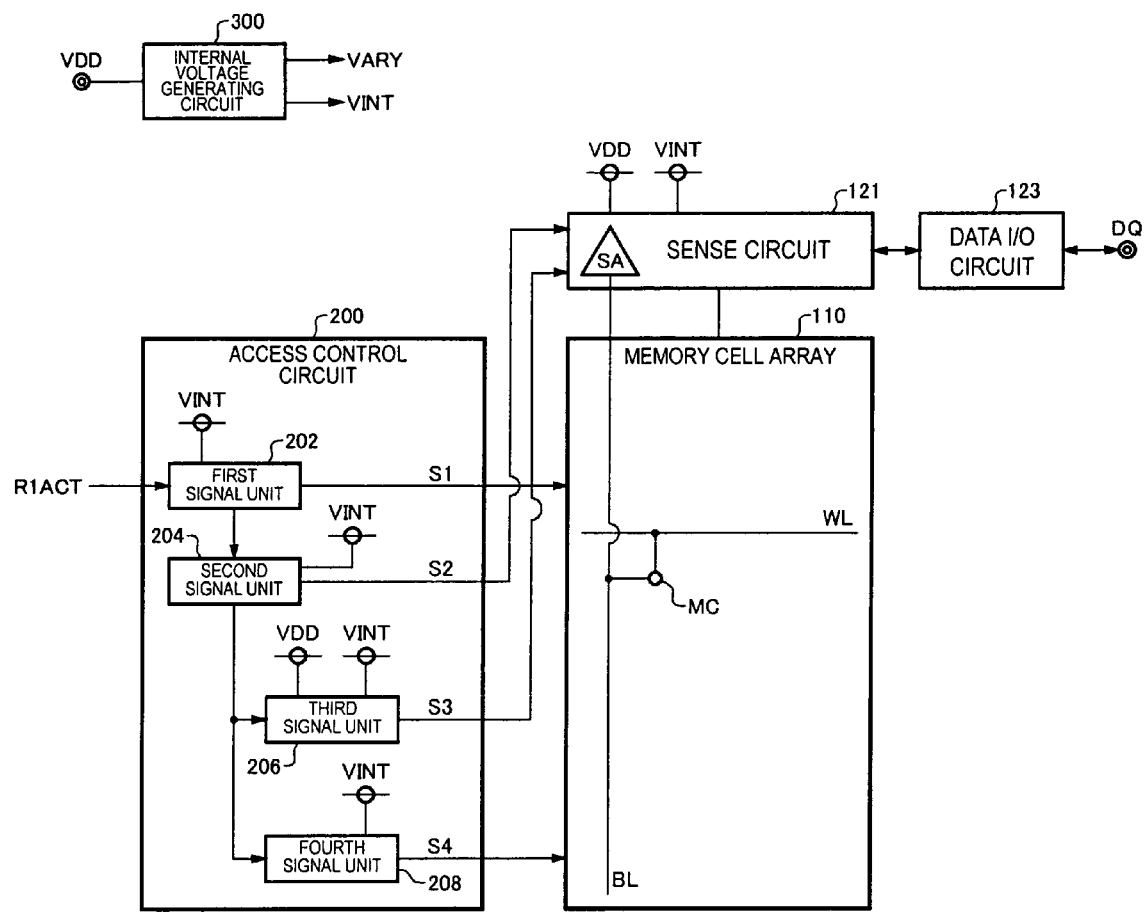
FIG. 1 is a schematic view for explaining the technical concept of the present invention.

Referring now to FIG. 1, the technical concept of the present invention lies in that signal generation by a fourth signal unit 208 that defines the inactivation period of word lines is based on a signal generated from signal generators (first and second signal generators 202 and 204) that are independent of an external voltage VDD. By supplying the external voltage VDD to a third signal unit 206, the external voltage VDD, which is equal to or higher than an internal voltage VARY, is supplied to the high-potential power supply node of each sense amplifier SA for a predetermined period of time. The signal generation by the third signal unit 206 that defines the overdrive period depends on the external voltage VDD. FIG. 1 schematically shows the relationship particularly between a memory cell MC and a data input/output circuit 123. In a memory cell array 110, respective word lines WL intersect with respective bit lines BL, and the memory cells MC are placed at the intersection points between the word lines WL and the bit lines BL. In FIG. 1, only the memory cell MC placed at the intersection point between a word line WL and a bit line BL is shown. A semiconductor device 100 receives the external voltage VDD supplied from an external power supply terminal. An internal voltage generating circuit 300 outputs the internal voltage VARY and an internal voltage VINT. The internal voltage VARY and the internal voltage VINT are output as fixed values, regardless of fluctuations of the external voltage VDD. The internal voltage VARY is supplied to a sense circuit 121, and corresponds to the information at the high level in the memory cell MC. The internal voltage VINT is supplied to the first signal unit 202, the second signal unit 204, the third signal unit 206, and the fourth signal unit 208. The external voltage VDD is also supplied to the third signal unit 206.

Each memory cell MC is connected to the data input/output circuit 123 via the sense circuit 121. The sense circuit 121 includes sense amplifiers SA corresponding to the respective bit lines BL. For example, each sense amplifier SA is provided for a pair of bit lines BL in a so-called open bit line structure or a folded bit line structure. When a sense amplifier SA is activated, the potential difference between the corresponding two bit lines BL is amplified, and the memory cells MC are then electrically connected to the data input/output circuit 123 via the bit lines BL.

An access control circuit 200 controls the operation timings of the word lines WL and the sense amplifiers SA. The access control circuit 200 includes the first signal unit 202, the second signal unit 204, the third signal unit 206, and the fourth signal unit 208. When the first signal unit 202 receives an access request signal R1ACT for a memory cell MC from an external controller or a refresh timer 500 included in the semiconductor device 100, an access to the memory cell array 110 starts. The first signal unit 202 outputs a first signal S1 for controlling activation and inactivation of the word lines WL. The second signal unit 204 outputs a second signal S2 for controlling activation and inactivation of the sense amplifiers SA. The third signal unit 206 outputs a third signal S3 indicating whether to supply an overdrive voltage (the external voltage VDD) to the power supply nodes of the sense amplifiers SA. The fourth signal unit 208 outputs a fourth signal S4 for controlling inactivation of the word lines WL.

The outline of the operation flow of a data access in response to an access request is as follows. First, a word line WL is activated, and the potentials of the bit lines BL are varied by the potentials of the corresponding memory cells MC. The sense amplifiers SA are then activated. To improve the initial sensitivity and increase the initial sensing speed in the sense amplifiers SA, the overdrive voltage is additionally and temporarily supplied to the sense amplifiers SA. The sense amplifiers SA amplify the potential differences between the bit lines BL, and re-stores the amplified potentials into the memory cells MC. In response to a data input/output command to output the data stored in the memory cells MC to a data input/output terminal DQ as an external terminal of the semiconductor device 100, the data input/output circuit 123 recognizes the potential differences amplified by the sense amplifiers SA as the data stored in the memory cells MC, and outputs the amplified potential differences to the data input/output terminal DQ. After that, the word line WL is inactivated.

In this embodiment, the word lines WL are activated by the first signal S1 activated by the first signal unit 202. As will be described later in detail, in a normal memory access that is an access request from an external controller (hereinafter simply referred to as a "normal access"), a word line WL to be activated is selected in accordance with a row address supplied separately from others. In a refreshing operation that is an access request from the refresh timer 500, a word line WL to be activated is selected in accordance with a refresh address supplied from a refresh address generating circuit. Soon after the activation (generation) of the first signal S1, the second signal unit 204 activates the second signal S2 to activate the sense amplifiers SA. The timing to activate (generate) the second signal S2 is delayed relative to the timing to activate the first signal S1, because a period of time is secured to generate a sufficient potential difference between each pair of bit lines BL after the word line WL is activated.

The third signal unit 206 activates the third signal S3 almost at the same time as the activation of the second signal S2. Through the activation of the third signal S3, the overdrive voltage is temporarily supplied to the high-potential power supply nodes of the sense amplifiers SA. The overdrive voltage in this embodiment is the external voltage VDD, which is higher than the internal voltage VARY. The overdrive time depends on the external voltage VDD. The overdrive time is determined by the runtime, and the third signal unit 206 inactivates the third signal S3 after a predetermined period of time.

Even later, the fourth signal unit 208 outputs the fourth signal S4 to the first signal unit 202 to inactivate the word line WL (this aspect will be described later in detail). The timing to activate the fourth signal S4 is set by taking into account the period from the driving of a sense amplifier SA to the complete amplification of the potential difference between a pair of bit lines BL. In the semiconductor device 100 in this embodiment, the timing to activate the fourth signal S4 is not synchronized with the end of the overdrive time, but is determined on the basis of the timing to activate the second signal S2. In other words, the timing to activate the fourth signal S4 is not affected by the overdrive time. In response to the activation of the fourth signal S4, the first signal unit 202 inactivates the first signal S1. In response to the inactivation of the first signal S1, the word line WL is inactivated.

After the first signal S1 is activated, the second signal S2 and the third signal S3 are activated, and lastly, the fourth signal S4 is activated. This sequence is the same as above. However, the signal transmission path for the third signal S3 and the signal transmission path for the fourth signal S4 are separated from each other, so that the timing to activate the fourth signal S4 does not change (fluctuate) due to the overdrive time affected by the third signal S3 (the time for overdriving that varies with the external voltage VDD). As a result, even if the external voltage VDD fluctuates, the timing to activate the fourth signal S4 can be stabilized. Accordingly, the units of time to be secured in terms of design can be estimated in a reliable manner.

In the following, a specific structure and control of the semiconductor device 100 are described based on an embodiment.

(Embodiment)

Figure 2:
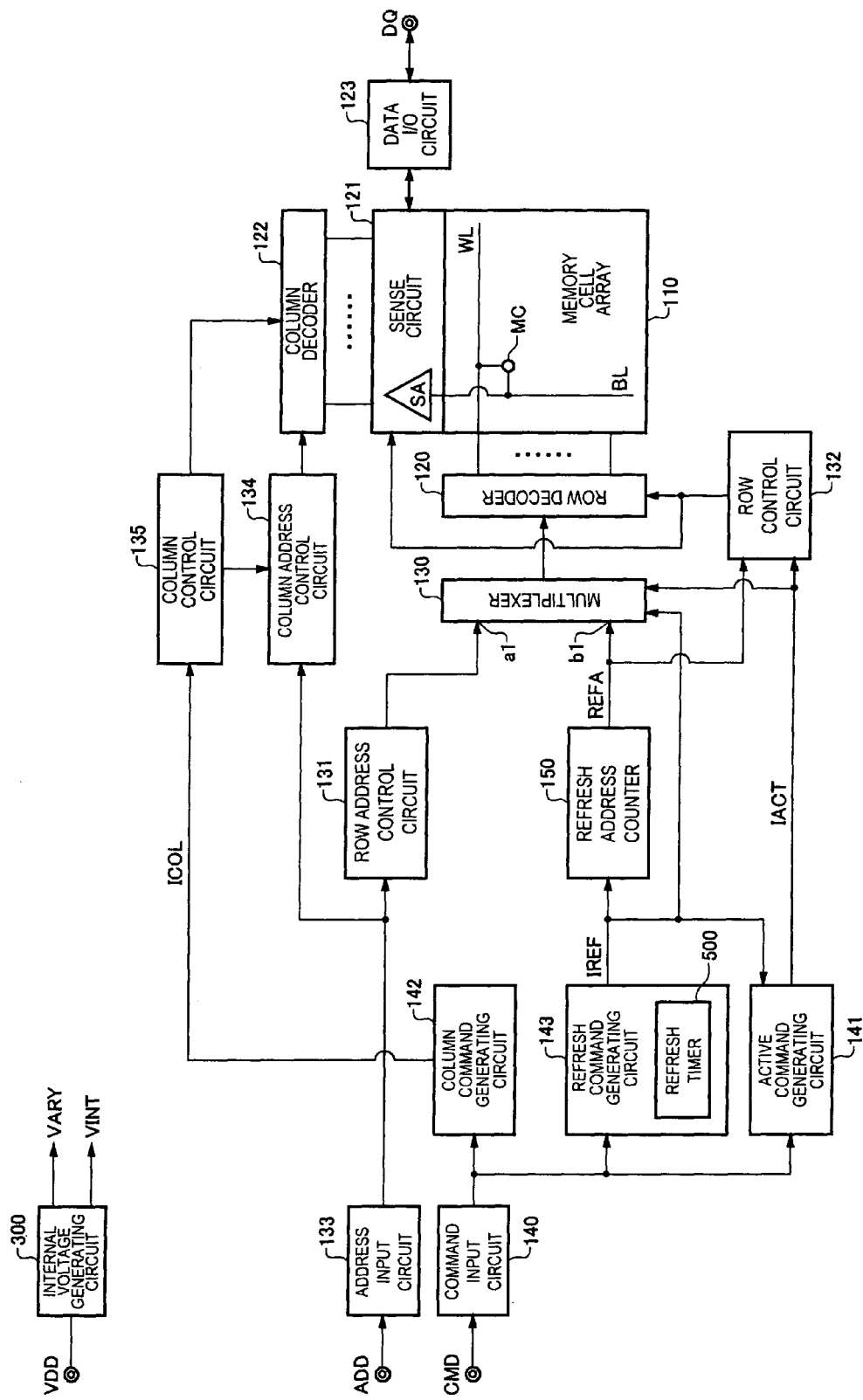
FIG. 2 is a functional block diagram of the semiconductor device indicative of an embodiment of the present invention.

Turning to FIG. 2, the semiconductor device 100 according to this embodiment has a memory cell array 110 including the memory cells MC. In FIG. 2, only the memory cell MC placed at the intersection point between a word line WL and a bit line BL is shown. A semiconductor device 100 receives the external voltage VDD supplied from an external power supply terminal. The internal voltage generating circuit 300 generates the internal voltage VARY and the internal voltage VINT from the external voltage VDD. The internal voltage VARY and the internal voltage VINT are output as fixed values, regardless of fluctuations of the external voltage VDD. The internal voltage VARY is supplied to the sense circuit 121, and corresponds to the information on the "high" side in each memory cell MC. The internal voltage VINT is supplied to a row control circuit 132. The external voltage VDD is supplied to the row control circuit 132.

A word line WL is selected from the word lines WL by a row decoder 120. The access control circuit 200 of FIG. 1 is substantially equivalent to the row decoder 120 and the row control circuit 132. The respective bit lines BL are connected to the corresponding sense amplifiers SA in the sense circuit 121, and a sense amplifier SA selected by a column decoder 122 is connected to the data input/output circuit 123. The data input/output circuit 123 is connected to a data input/output terminal DQ. In a reading operation, read data that is read from the memory cell array 110 is output to the outside via the data input/output terminal DQ. In a writing operation, write data that is input from outside to the data input/output terminal DQ is supplied to the memory cell array 110.

A row address is supplied from a row address control circuit 131 to the row decoder 120 via a multiplexer 130. The row decoder 120 is controlled by the row control circuit 132. The row address control circuit 131 is a circuit to which the row address among addresses (external addresses) that are input to an address input circuit 133 via an address terminal ADD is supplied.

In a case where a command that is input to a command input circuit 140 via a command terminal CMD is an active command (an ACT command), an active command generating circuit 141 activates an active instruction IACT, and supplies the active instruction IACT to the row control circuit 132. The active instruction IACT is equivalent to the access request signal R1ACT of FIG. 1. The active instruction IACT is also supplied to the multiplexer 130. When the active instruction IACT is activated, and a refresh instruction IREF is inactivated, the multiplexer 130 selects an input node a1. Accordingly, when an active command and a row address are input from outside, the row decoder 120 activates the word line WL indicated by the row address input from outside. As the word line WL is activated, the information in all the memory cells selected through the word line WL is read out, and is amplified by the sense amplifiers SA.

A column address is supplied from a column address control circuit 134 to the column decoder 122. The column decoder 122 is controlled by a column control circuit 135. The column address control circuit 134 is a circuit to which the column address among addresses (external addresses) that are input to the address input circuit 133 via the address terminal ADD is supplied. In a case where a command that is input to the command input circuit 140 via the command terminal CMD is a column command (a read command or a write command), a column command generating circuit 142 activates a read/write instruction ICOL, and supplies the read/write instruction ICOL to the column control circuit 135. Accordingly, when a column command and a column address are input from outside, the column decoder 122 selects the sense amplifier SA indicated by the column address input from outside. As a result, read data that is amplified by the selected sense amplifier SA is output to the data input/output circuit 123 in a reading operation, and the selected sense amplifier SA is overwritten with write data that is supplied from the data input/output circuit 123 in a writing operation.

Figure 7:
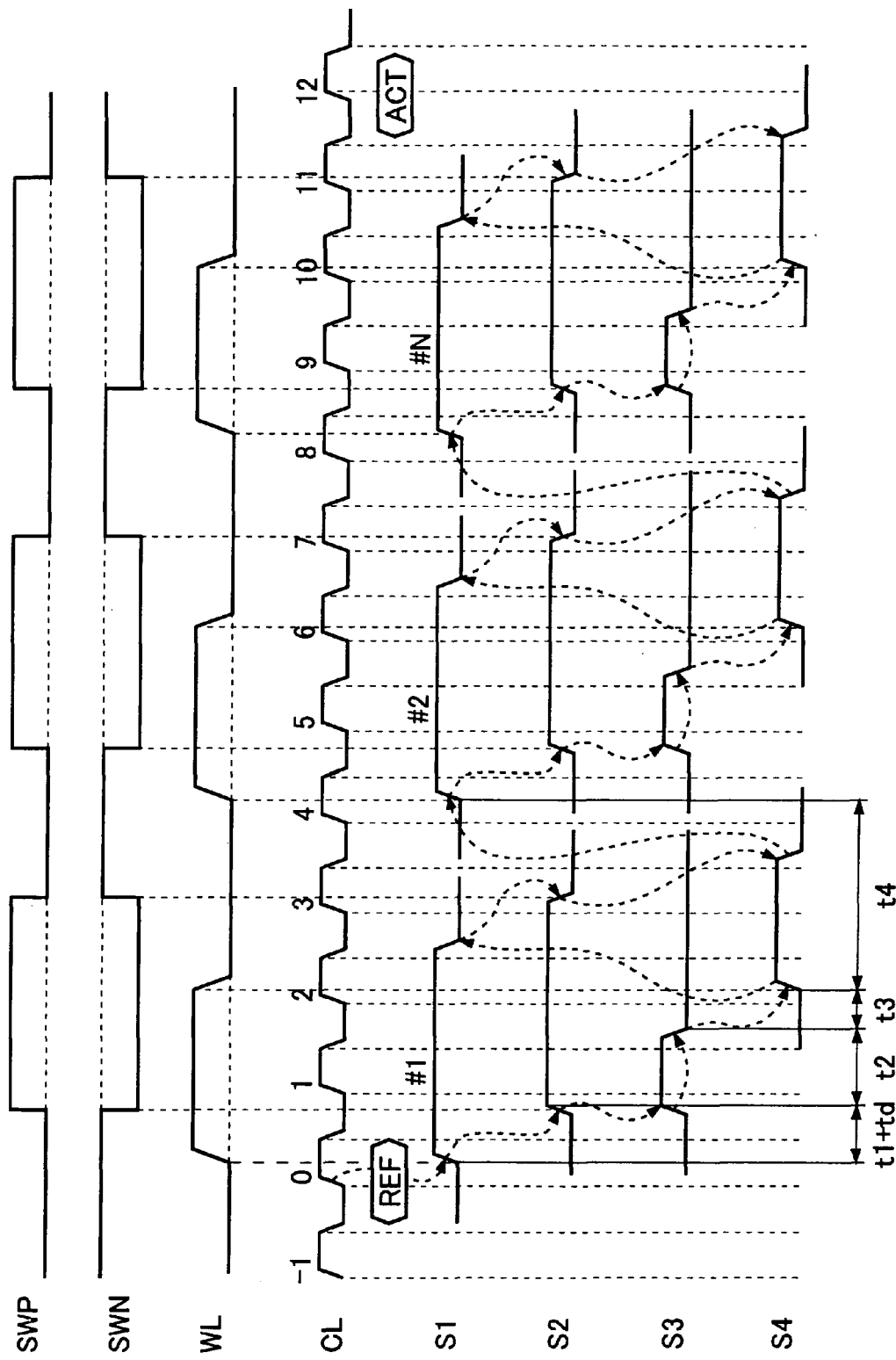
FIG. 7 is a timing chart of refreshing operations in the comparative example.

As well as the active command ACT and column commands READ and WRITE, an auto-refresh command REF and a self-refresh command SREF are supplied to the command terminal CMD. A refresh command generating circuit 143 includes the refresh timer 500. When the auto-refresh command REF is issued, the refresh command generating circuit 143 activates a refresh instruction IREF. When the self-refresh command SREF is issued, the refresh command generating circuit 143 activates the refresh timer 500, and the refresh timer 500 outputs a refresh signal at predetermined intervals. The refresh command generating circuit 143 repeatedly activates the refresh instruction IREF, in response to the auto-refresh command REF and a request signal. In FIG. 7, which will be described later, refresh instructions IREF denoted by #1 through #N are activated. Here, N is a natural number. When the refresh instruction IREF is activated, the count value in a refresh address counter 150 is updated (incremented or decremented), and a refresh address REFA that is the count value is supplied to the multiplexer 130.

The refresh instruction IREF is also supplied to the multiplexer 130. When the active instruction IACT is activated, and the refresh instruction IREF is activated, the multiplexer 130 selects an input node b1. The refresh address REFA that is output from the refresh address counter 150 is supplied to the row decoder 120, and the word line WL indicated by the refresh address REFA is activated. As the word line WL is activated, the information in all the memory cells selected through the word line WL is read out, and is amplified by the sense amplifiers SA. In this manner, those memory cells are refreshed. The refresh instruction IREF is also supplied to the row control circuit 132, and activates the row decoder 120. The refresh instruction IREF is supplied to the active command generating circuit 141, and the active instruction IACT is activated in response to the refresh instruction IREF.

Figure 3:
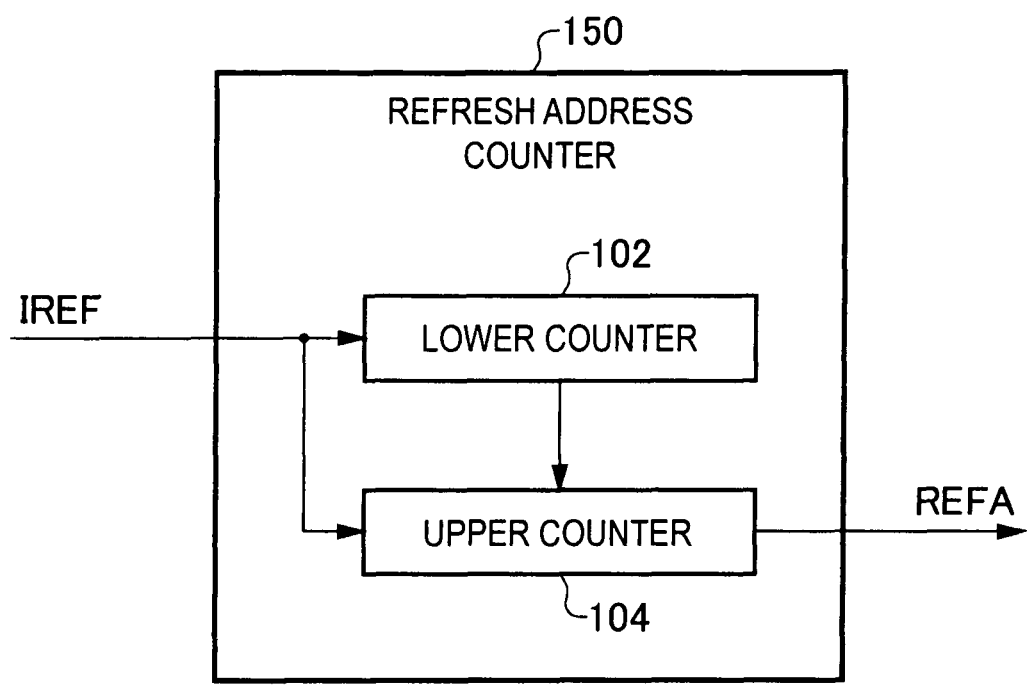
FIG. 3 is a functional block diagram of the refresh address counter shown in FIG. 2.

Turning to FIG. 3, the refresh address counter 150 includes a lower counter 102 and an upper counter 104. When a refresh instruction IREF is input, the refresh address counter 150 generates a refresh address REFA. Specifically, the count value in the lower counter 102 is incremented by 1 in response to N refresh instructions IREF. The count value in the upper counter 104 is incremented by 1 in response to one refresh instruction IREF. The refresh address REFA to select a word line WL is designed to have an upper address RX1 and a lower address RX2. For ease of explanation, RX1 is formed with two bits, and RX2 is formed with four bits. Also, N is 4, and four refresh instructions IREF are issued in chronological order.

When receiving a first refresh instruction IREF, the lower counter 102 sets RX2 to "0000." The upper counter 104 sets RX1 to "00." As a result, the refresh address counter 150 issues a refresh address REFA=000000 (a binary code). When receiving a second refresh instruction IREF, the upper counter 104 increments RX1 to "01," and the refresh address counter 150 issues a refresh address REFA=010000. Likewise, the refresh address counter 150 sequentially issues "100000" and "110000" in response to a (N−1) th refresh instruction IREF and a Nth refresh instruction IREF, respectively. The row decoder 120 successively activates N word lines WL in synchronization with those N refresh addresses REFA and N active instructions IACT.

When receiving a fifth refresh instruction IREF, the lower counter 102 increments RX2, and sets RX2 to "0001." In response to the fifth through eighth refresh instructions IREF, the upper counter 104 successively issues the four refresh addresses REFA, which are "000001," "010001," "100001," and "110001." In response to a ninth refresh instruction IREF and later instructions, the lower counter 102 and the upper counter 104 operate in the same manner as above. As described above, more than one word, line WL is refreshed every time a refresh instruction IREF is issued.

Figure 4:
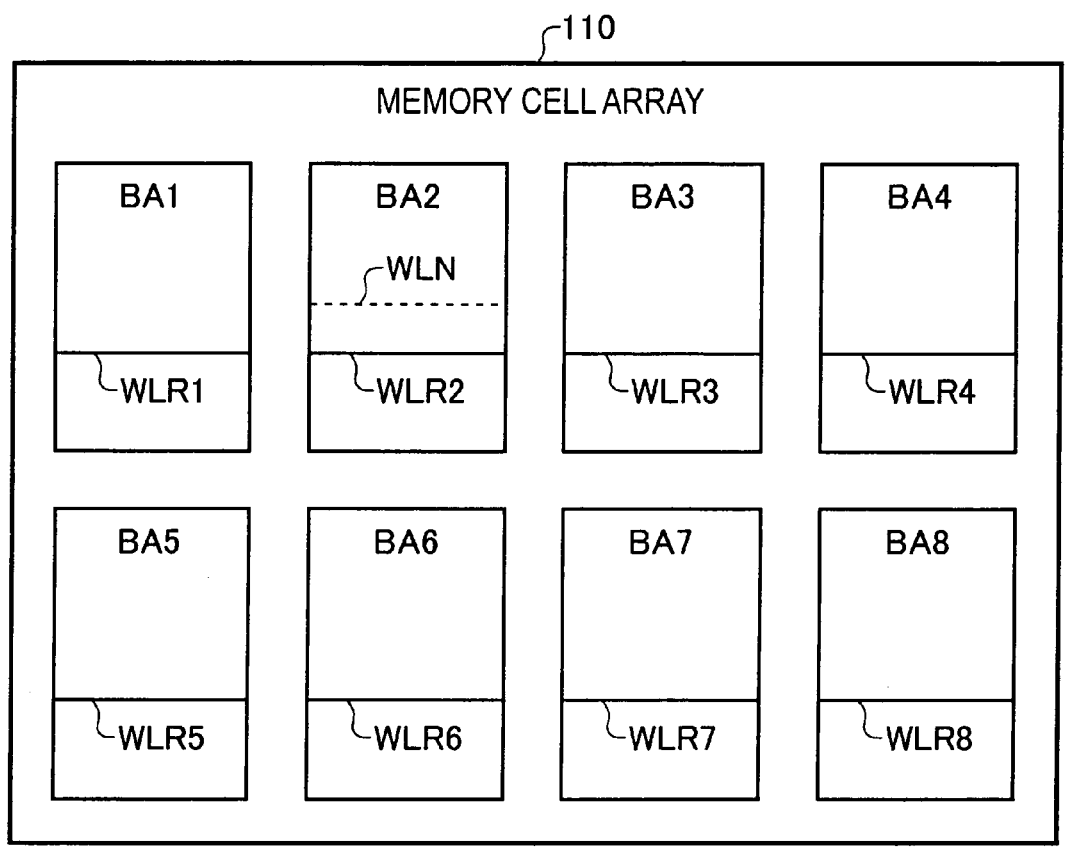
FIG. 4 is a schematic view showing the relationship between banks and word lines to be activated.

Turning to FIG. 4, the memory cell array 110 normally includes the banks BA. In the case of a normal access, a bank BA to be accessed is designated by part of a row address supplied from outside. In the example case illustrated in FIG. 4, the word line WLN of the bank BA2 is selected.

In the case of refreshing, the respective word lines WL of several banks BA are successively selected by refresh addresses REFA supplied from the refresh address counter 150. Since the refresh addresses REFA do not designate banks BA, the word lines WL (word lines WLR1 through WLR8) indicated by the refresh address REFA are simultaneously selected in a unit time. In other words, bank addresses are "Inhibit (don't care)." Therefore, in response to one active instruction IACT, the word lines WL (the word lines WLR1 through WLR8) of all the banks BA are selected. In response to one refresh command REF, N word lines WL are selected. Where N is 4, thirty-two word lines WL in total are activated in all the eight banks.

Figure 5:
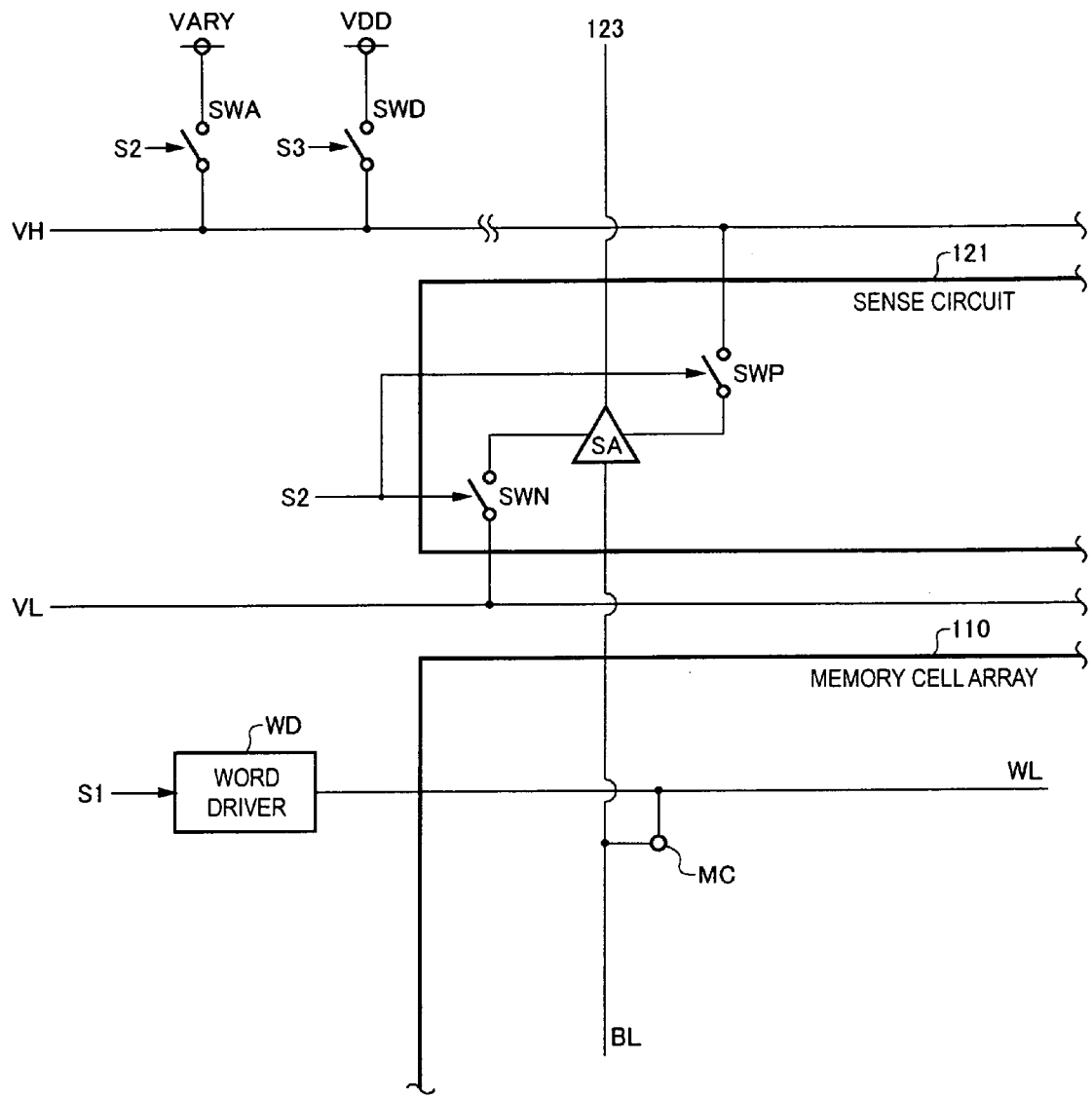
FIG. 5 is a circuit diagram of the components surrounding the sense circuit shown in FIG. 2.

Turning to FIG. 5, a higher power supply line VH and a lower power supply line VL are power supply lines for supplying a higher potential and a lower potential, respectively. The lower power supply line VL may be set to a ground potential. The high-potential power supply node and the low-potential power supply node of a sense amplifier SA are connected to the higher power supply line VH and the lower power supply line VL via a high-voltage switch SWP and a low-voltage switch SWN. The potential difference between the higher power supply line VH and the lower power supply line VL becomes the drive voltage for the sense amplifiers SA. An inverted signal of a second signal S2 is supplied to the high-voltage switch SWP. The second signal S2 is supplied to the low-voltage switch SWN. FIG. 5 schematically shows the relations of connection among a sense amplifier SA, a bit line BL, and the data input/output circuit 123. For example, in a reading operation, the bit line BL serves as the input node for the sense amplifier SA, and the output node of the sense amplifier SA serves as the input node for the data input/output circuit 123. The bit line BL is a pair of bit lines, and has a so-called open bit line structure or a folded bit line structure. The bit line BL may be a single-phase line. In that case, the intermediate potential between the two potentials corresponding to "0" and "1" is used as the threshold value.

When the first signal S1 is activated, a word driver WD in the row decoder 120 activates a word line WL. As a result of this, a memory cell MC is connected to the bit line BL, and the potential of the bit line BL is slightly changed by the charges stored in the memory cell MC. In this stage, the sense amplifier SA is not connected to the higher power supply line VH and the lower power supply line VL.

Soon after the activation of the word line WL, the second signal S2 and the third signal S3 are activated. As a result of this, driver switches SWA and SWD are turned on, and the external voltage VDD (the overdrive voltage), which is higher than the internal voltage VARY, is supplied to the higher power supply line VH. The internal voltage switch SWA prevents charges from flowing backward from the higher power supply voltage VH to the node for the internal voltage VARY. As the external voltage VDD (the overdrive voltage) higher than the internal voltage VARY is additionally supplied to the higher power supply line VH, the sensing speed and sensitivity in the initial sensing stage of the sense amplifier SA are increased. As the third signal S3 is inactivated even later, only the internal voltage VARY is supplied to the higher power supply line VH.

After the overdrive time has passed, the third signal S3 returns to an inactivated state, and the external voltage switch SWD is turned off. The length of the overdrive time depends on the magnitude (or the value) of the external voltage VDD. The fully activated sense amplifier SA amplifies the potential of the bit line BL.

As the time required before the potential of the bit line BL is sufficiently amplified to the internal voltage VARY is taken into consideration, the fourth signal S4 is activated even later. As a result of this, the first signal S1 is inactivated, and the word line WL is inactivated in response to the inactivation of the first signal S1. If the information stored in the memory cell MC is "1," the internal voltage VARY is substantially restored. Where the information stored in the memory cell MC is "0," a low potential VSS is re-stored. In synchronization with the activation of the fourth signal S4, the first signal S1 is inactivated. A little later, the second signal S2 is inactivated, and lastly, the fourth signal S4 is inactivated. In this manner, all the first through fourth signals S1 through S4 return to inactivated states, and become ready for the next access request signal R1ACT.

Since the overdrive time depends on the external voltage VDD, the timing to inactivate the third signal S3 varies with operating conditions. In other words, the timing to inactivate the third signal S3 cannot be accurately estimated in the stage of design.

In the following, a structure in which the overdrive time affects unit time is described as a comparative example (FIGS. 6 and 7), and the problems with the structure are pointed out. After that, a structure in which the unit time is not affected by the overdrive time is described as this embodiment (a first example (FIGS. 8 and 9) and a second example (FIGS. 10 and 11)).

Figure 6:
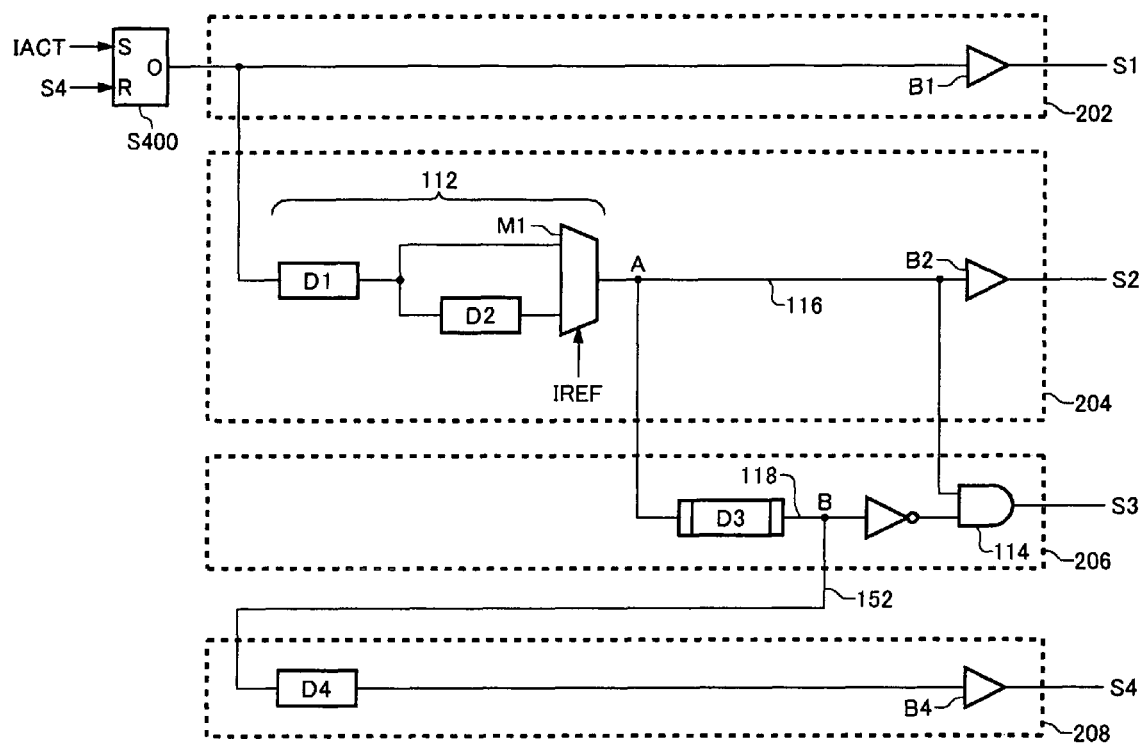
FIG. 6 is a circuit diagram showing part of the row control circuit in the comparative example.

Turning to FIG. 6, the row control circuit 132 includes the first signal unit 202, the second signal unit 204, the third signal unit 206, and the fourth signal unit 208. The internal voltage VINT serves as the operating voltage for the first signal unit 202, the second signal unit 204, the third signal unit 206, and the fourth signal unit 208. The external voltage VDD serves as the operating voltage for a delay element D3 included in the third signal unit 206. The first signal unit 202 receives signals supplied from a logic circuit 400 including a set terminal S and a reset terminal R. Active instructions IACT are supplied to the set terminal S of the logic circuit 400. The fourth signal S4 is supplied to the reset terminal R of the logic circuit 400. When an access request signal IACT is activated, the first signal unit 202 activates the first signal S1 through the logic circuit 400 and a buffer B1. The timing to activate the first signal S1 is of course independent of the external voltage VDD.

The second signal unit 204 delays an active instruction IACT (an output signal from the logic circuit 400) through a second delay unit 112. The active instruction IACT is activated as the second signal S2 through a buffer B2. The second delay unit 112 includes a delay element D1, a delay element D2, and a multiplexer M1. The delay element D1 and the delay element D2 are both independent of the external voltage VDD. In other words, the second delay unit 112 is an invariable delay element that does not change its amount of delay with the external voltage VDD. Therefore, the timing to activate the second signal S2 is independent of the external voltage VDD.

The multiplexer M1 is controlled by a refresh instruction IREF. The multiplexer M1 uses the delay element D2 at the time of refreshing, but does not use the delay element D2 at the time of a normal access. Where the amount of delay caused by the delay element D1 is represented by "t1 (a second fundamental amount of delay)," and the amount of delay caused by the delay element D2 is represented by "td (a second additional amount of delay)," the timing to activate the second signal S2 at the time of a normal access is delayed relative to the timing to activate the first signal S1 by t1. At the time of refreshing, on the other hand, the timing to activate the second signal S2 is delayed by t1+td. At the time of refreshing, a longer period of time is required for activating a word line WL than that at the time of a normal access. Therefore, a margin is secured by increasing the amount of delay by td. If the number of word lines WL to be activated by one active instruction IACT is n at the time of a normal access, the maximum number of word lines WL to be activated by one active instruction IACT at the time of refreshing is 8n (see FIG. 4). The word lines WL to be activated by one active instruction IACT at the time of refreshing may be simultaneously activated, or may be sequentially activated at short intervals (staggered activation).

An AND circuit 114 of the third signal 206 activates the third signal S3 when the second signal S2 is activated. As a result of this, overdriving is started. At point A, the signal line of the second signal S2 branches into a second signal line 116 for transmitting the second signal S2 and a third signal line 118 for transmitting the third signal S3. The delay element D3 is inserted to the third signal line 118. The external voltage VDD is supplied to the delay element D3. The delay element D3 includes a voltage level shifter (not shown). The delay element D3 is a variable delay element that changes its amount of delay with the magnitude of the external voltage VDD. The amount of delay caused by the delay element D3 is represented by t2.

When the second signal S2 at the high level (in an activated state) reaches the AND circuit 114 from the branch point A via the delay element D3, the third signal S3 is inactivated. Where the external voltage VDD is high, the amount of delay t2 is large, and the overdrive time is short. Where the external voltage VDD is low, on the other hand, the amount of delay by the delay element D3 is small, and the overdrive time is long. When the overdrive time comes to an end, each of the first signal S1 and the second signal S2 is in an activated state, and each of the third signal S3 and the fourth signal S4 is in an inactivated state.

At point B, the third signal line 118 further branches into a fourth signal line 152 for transmitting the fourth signal S4. The active instruction IACT having passed through the variable delay element D3 passes through a delay element D4, which is an invariable delay element. The active instruction IACT then activates the fourth signal S4 through a buffer B4. The amount of delay caused by the delay element D4 is represented by t3. In the comparative example illustrated in FIG. 6, the timing to activate the fourth signal S4 is delayed relative to the timing to activate the active instruction IACT (the first signal S1) by t1+t2+t3 or t1+td+t2+t3. Since the amount of delay t2 depends on the external voltage VDD, the timing to activate the fourth signal S4 is designed to vary with the magnitude of the external voltage VDD.

Turning to FIG. 7, in response to one refresh command REF, different word lines are sequentially selected, and eight banks and twenty-four word lines in total are activated. Here, standards for tRFC are applied, and tRFC indicates the period from issuance of one refresh command REF to issuance of one active command ACT. The tRFC standards are standards related to the semiconductor device 100 and the controllers. Where #N is 3, twenty-four word lines WL in the eight banks in total are activated in a tRFC period. Eight word lines WL are activated per unit time. Each unit time is formed with t1+td+t2+t3+t4. An operation in a first unit of time is performed in synchronization with a clock CL, which is output from a synchronization clock generating circuit (not shown) included in the semiconductor device 100. In response to one refresh command REF (the clock CL being 0), the semiconductor device 100 performs three internal refreshing operations when the clock CL is 0, 4, and 8. The second and third internal refreshing operations are not synchronized with the clock CL (=4, 8). Here, t4 represents the return period from activation of the fourth signal S4 to inactivation of the fourth signal S4. Precharge of the bit lines BL and equalization are also performed during this period. The inactivation of the fourth signal S4 is the activation trigger for the second and third refresh instructions IREF corresponding to the second and third internal refreshing operations. First, when the clock CL is 0, an active instruction IACT is activated, the first signal S1 is activated, and word lines WL are activated. The delay elements D1 and D2 delay the second signal S2 by t1+td, and the second signal S2 is then activated. The high-voltage switch SWP and the low-voltage switch SWN are then turned on, and sense amplifiers SA are activated. At the same time, the third signal S3 is also activated. After the time of delay t2 generated by the delay element D3 has passed, the overdriving comes to an end.

After the time of delay t3 has passed since the end of the overdriving, the fourth signal S4 is activated. In synchronization with the activation of the fourth signal S4, the word lines WL are inactivated, and the first signal S1 is inactivated. As the first signal S1 is inactivated, the second signal S2 is inactivated, and lastly, the fourth signal S4 is also inactivated. In this manner, all the first through fourth signals S1 through S4 return to the inactivated states. In the example case illustrated in FIG. 7, the next active instruction IACT is responded to when the clock CL is 4. Therefore, the unit time in the tRFC period is the period from the time when the clock CL is 0 to the time when the clock CL is 4, the period from the time when the clock CL is 4 to the time when the clock CL is 8, and the period from the time when the clock CL is 8 to the time when the clock CL is 12. However, since the timing to activate the fourth signal S4 depends on the external voltage VDD, the unit time vary. When the value of the external voltage VDD is small, the unit time is long. Therefore, to maintain a predetermined re-stored potential (98% of the internal voltage VARY) that determines the refresh intervals for the memory cells MC, there is a possibility that the prolonged unit time do not fall within the tRFC period (a first problem: the relationship between the tRFC period and the units of time). Further, if the ON-state period during which the driver switch SWD (see FIG. 5) is electrically energized is long, the absolute values of the higher potentials of the higher power supply line VH and the bit lines become higher than the internal voltage VARY. Also, there is a possibility that the memory cells MC break down. To prevent this, the delay element D3 (t2) is designed so that the unit time fall within the tRFC period, regardless of whether or not the value of the external voltage VDD is small. Where the delay element D3 is designed in this manner, the time of delay (t2) by the delay element D3 is too short, and there is a possibility that the re-stored potential becomes insufficient (a second problem: the relationship between the unit time and the re-stored potential). The first and second problems are caused, since the timing to activate the fourth signal S4 to inactivate the word lines WL is determined on the basis of the branch point B (see FIG. 6). The timing chart in FIG. 7 is compliant with the tRFC standards. However, those problems also occur under the standards for tRC, which indicates the period from one active command ACT supplied from outside to the next active command ACT.

In response to one refresh command REF, n refresh instructions IREF are generated. In response to one request signal from the refresh timer 500, n refresh instructions IREF are generated. As described with reference to FIG. 3, in response to n refresh instructions IREF, n refresh addresses REFA are generated. In response to n refresh instructions IREF, n active instructions IACT are generated.

Figure 8:
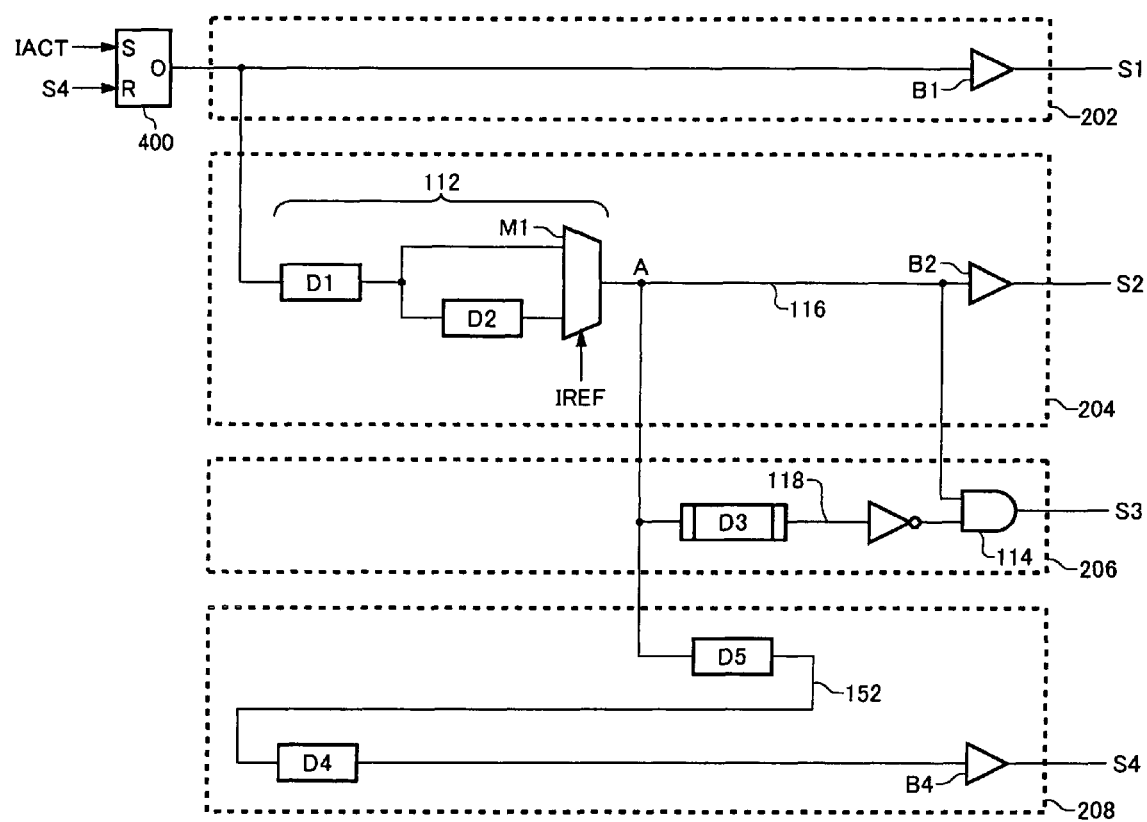
FIG. 8 is a circuit diagram showing part of the row control circuit in the first example of this embodiment.

Turning to FIG. 8, each "unit time" is set on the basis of the internal voltage VINT, so as to satisfy "tRFC" and "tRC", regardless of the "overdrive period." The "overdrive period" depends on the external voltage VDD. The "overdrive period" is set so that "the higher potential of the bit lines is not made equal to or higher than the internal voltage VARY," regardless of the "unit time." As each "unit time" does not depend on the external voltage VDD, the first problem and the second problem are avoided. The first example (FIG. 8) of this embodiment differs from the comparative example (FIG. 6) in that, at the point A, the signal line branches into the three signal lines: the second signal line 116, the third signal line 118, and the fourth signal line 152. Other than that, this example is the same as the comparative example (FIG. 6). The output of the variable delay element D3 depending on the external voltage VDD is supplied only to the third signal line 118. The fourth signal S4 is activated when an active instruction IACT passes through the logic circuit 400, the second delay unit 112, a delay element D5, and the delay element D4. Since the second delay unit 112, the delay element D5, and the delay element D4 are independent of the external voltage VDD, the timing to activate (generate) the fourth signal S4 becomes independent of the external voltage VDD. That is, this example differs from the comparative example (FIG. 6) in that the third signal line 118 and the fourth signal line 152 are separated from each other so that the delay element D3 affects only the timing to inactivate the third signal S3.

Where the time of delay by the second delay unit 112 is t1 or "t1+td (a second delay time)," the second signal S2 and the third signal S3 are activated t1 or "t1+td" later than activation of an active instruction IACT. Where the time of delay by the delay element D4 and the delay element D5 is t3 (a fourth delay time), the fourth signal S4 is activated t3 later than the timing to activate the second signal S2. In this embodiment, however, the time of delay t3 is independent of the external voltage VDD.

In the case of refreshing, the second signal S2 is generated "t1 (the second fundamental amount of delay)+td (the second additional amount of delay)" later than the timing to activate the first signal S1. At the time of a normal access, the second signal S2 is generated t1 (the second fundamental amount of delay) later than the first signal S1.

Figure 9:
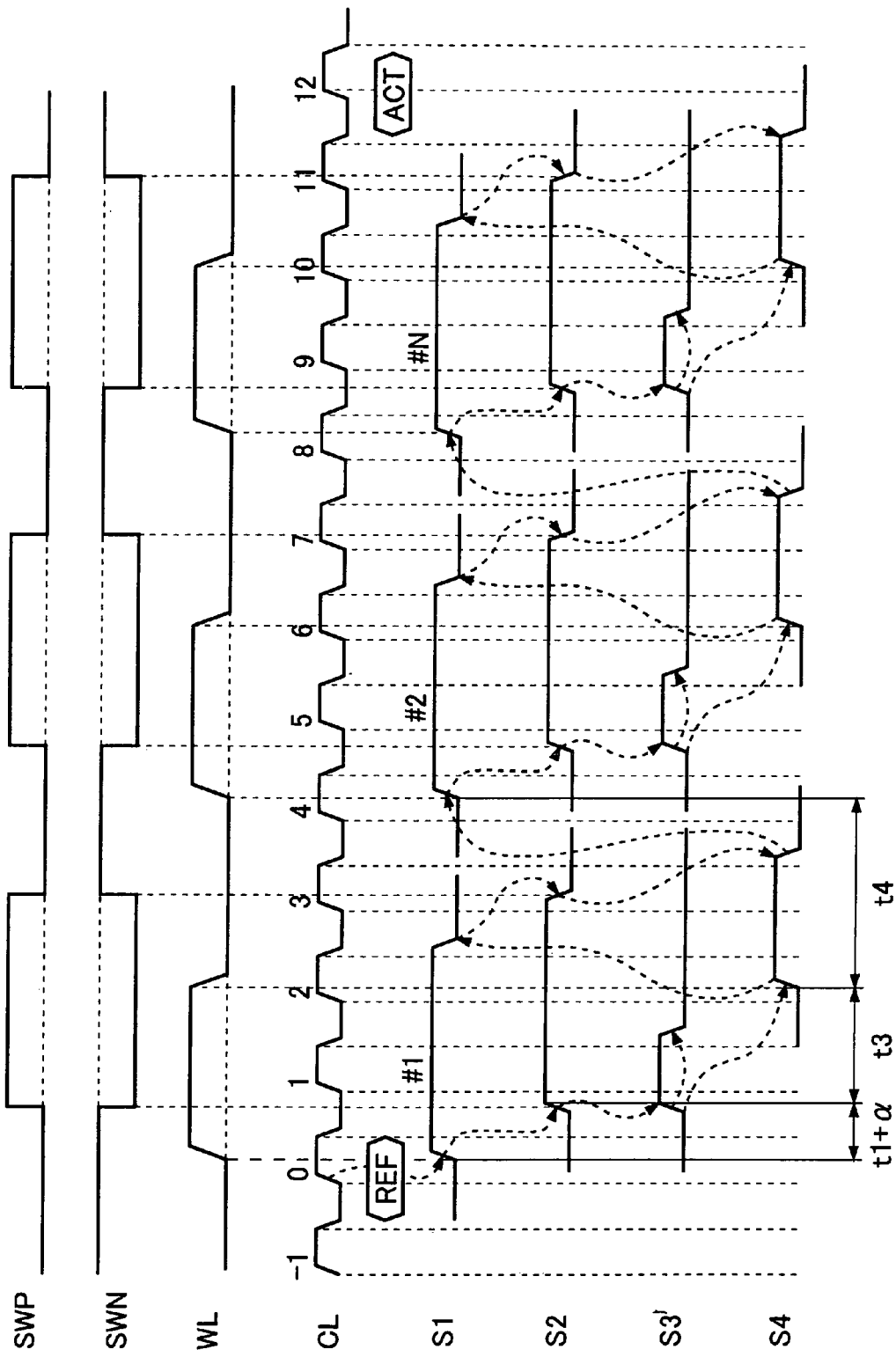
FIG. 9 is a timing chart of refreshing operations in the first example of this embodiment.

Turning to FIG. 9, the first signal S1 is activated, and the second signal S2 and the third signal S3 are activated. The overdrive time then comes to an end. The operation flow up to this point is the same as that in the comparative example (FIG. 7).

In the first example of this embodiment, the timing to end the fourth signal S4 is not determined on the basis of the timing to end the overdrive time, but is determined on the basis of the timing to input the access request signal R1ACT. In the example case illustrated in FIG. 9, the fourth signal S4 is activated when the clock CL is 2. This timing is independent of the external voltage VDD, and therefore, is stable. The operation flow after the activation of the fourth signal S4 is the same as that in the comparative example.

As a result, the unit time in refreshing operations does not depend directly on the overdrive time, and it becomes easier to accurately estimate the unit time to be secured in the stage of design. The same applies to the unit time in normal accesses. The input node of the delay element D5 may be an active instruction IACT, instead of the point A (a third example (not shown) of this embodiment). In that case, the time of delay by the delay element D5 is set longer than the time of delay by the delay element D5 of the first example (FIG. 8). Still, the third example of this embodiment substantially has the same effects as those of the later described second example (FIG. 10) of this embodiment.

Figure 10:
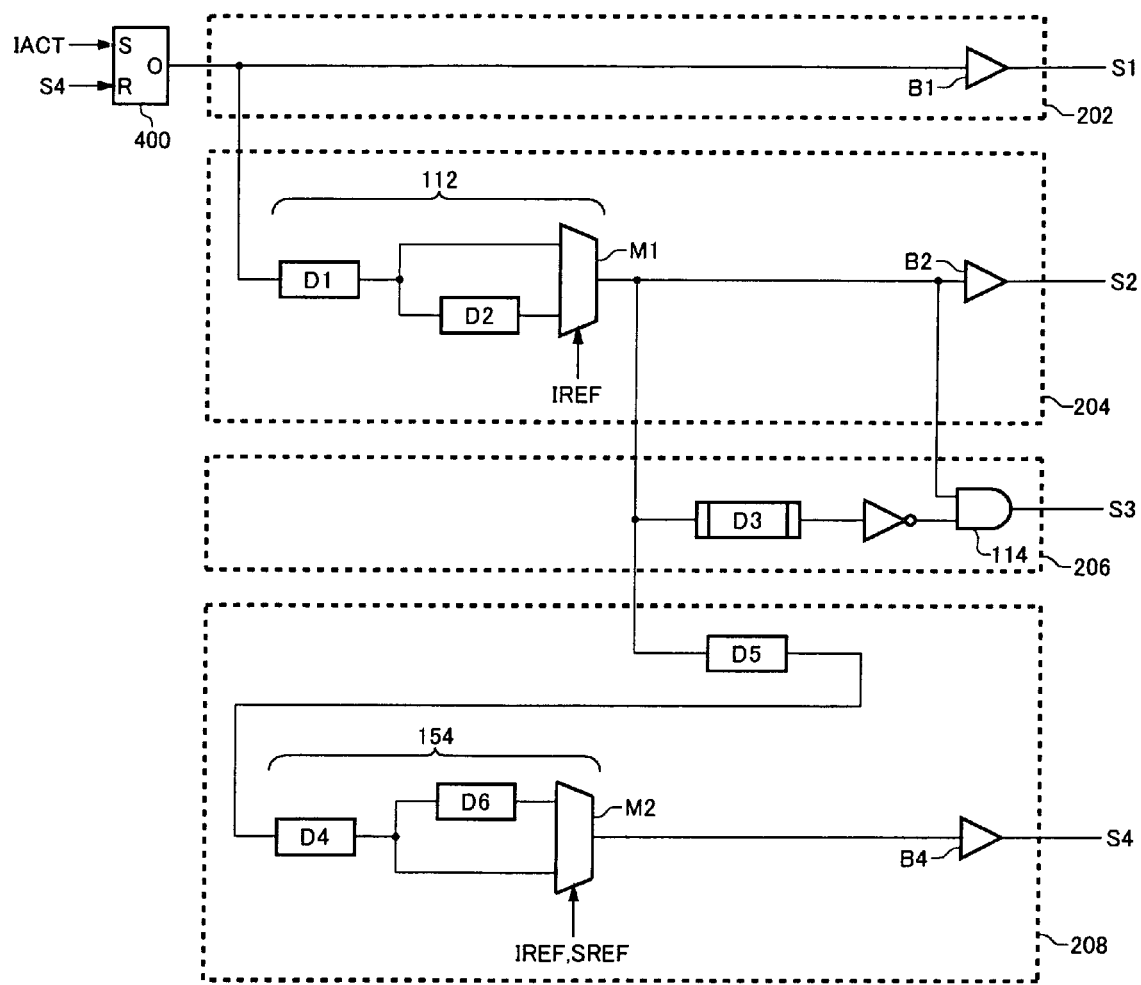
FIG. 10 is a circuit diagram showing part of the row control circuit in the second example of this embodiment.

Turning to FIG. 10, the difference from the first example (FIG. 8) is that the delay element D4 is replaced with a fourth delay unit 154. The time (the second additional amount of delay td) prolonged by the delay element D2 at the time of refreshing is cancelled by a delay element D6, so that the unit time at the time of refreshing becomes the same as the unit time at the time of a normal access. At the time of refreshing, N refreshing operations are performed. Therefore, the time from the activation of the sense amplifiers SA to the resetting of the word lines WL (D5+D4) is shorter than the corresponding time (D5+D4+D6) in a normal access. The re-stored potential at the time of refreshing is slightly lower than the re-stored potential at the time of a normal access. However, this does not present a problem, since the intervals of refreshing are made shorter than the intervals between refresh commands REF by the N refreshing operations. The internal voltage VINT is supplied as the operating voltage for the fourth delay unit 154. The fourth delay unit 154 includes the delay element D4, the delay element D5, and a multiplexer M2. The delay element D4 and the delay element D6 are both independent of the external voltage VDD. In other words, the fourth delay unit 154 is an invariable delay element that does not depend on the external voltage VDD. The multiplexers M1 and M2 are controlled by refresh instructions IREF. The multiplexer M2 uses the delay element D6 at the time of a normal access, but does not use the delay element D6 at the time of refreshing. The amount of delay caused by the delay element D4 is a "fourth fundamental amount of delay," and the amount of delay caused by the delay element D6 is a "fourth additional amount of delay." As well as the refresh instructions IREF, self-refresh commands SREF or request signals output from the refresh timer 500 may control the multiplexer M2. The multiplexer M2 selects the delay route formed with the delay element D4 and the delay element D5 at the time of self-refreshing as well as a normal access. In other words, the multiplexer M2 selects the delay route formed only with the delay element D4, only when a refresh command REF is supplied. With this arrangement, even in a self-refreshing operation to which the tRFC standards are not applied, the re-stored potential can be maximized (to 100% of the internal voltage VARY).

To sum up, in a normal access, the fourth signal S4 is delayed by the delay elements D1, D5, D4, and D6. In a refreshing operation, the fourth signal S4 is delayed by the delay elements D1, D2, D5, and D4. If the amount of delay by the delay element D2 (the second additional amount of delay) is made equal to the amount of delay by the delay element D6 (the fourth additional amount of delay), the timing to activate the fourth signal S4 becomes the same, regardless of whether the operation is a refreshing operation or a normal access. As a result, the design of the other circuits for timing setting becomes even simpler.

Figure 11:
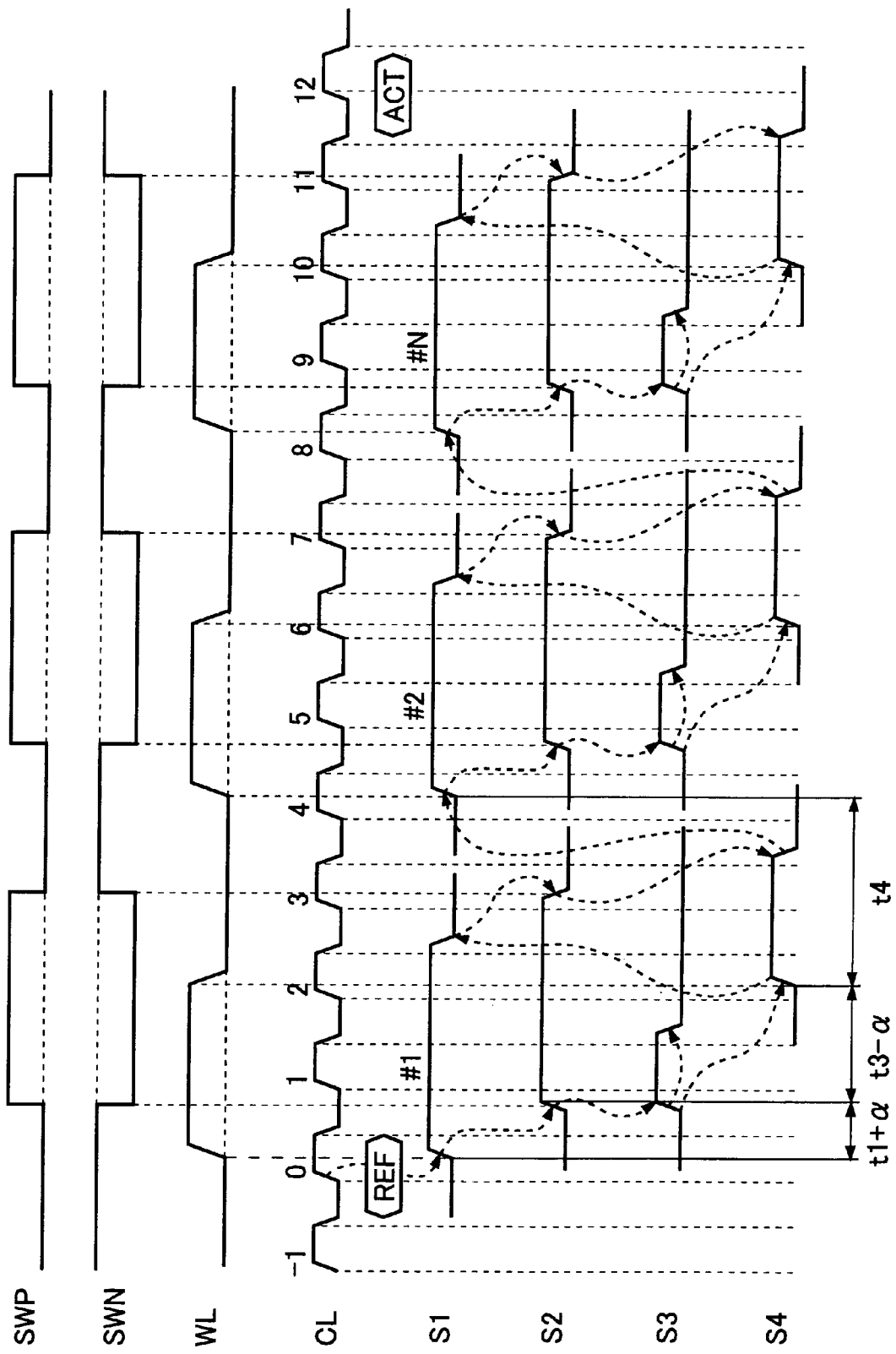
FIG. 11 is a timing chart of refreshing operations in the second example of this embodiment.

Turning to FIG. 11, the fundamental operation flow is the same as that in the first example (FIG. 9). However, this example differs from the first example in that the timing to activate the fourth signal S4 is the same, regardless of whether the operation is a refreshing operation or a normal access.

The semiconductor device 100 has been described so far through an embodiment. According to this embodiment, the length of each unit time is not affected by fluctuations of the external voltage VDD, and the period of time required for a data access can be accurately estimated in the stage of design. Further, the unit time can be prevented from varying depending on whether the operation is a refreshing operation or a normal access.

The circuit forms in the respective circuit blocks disclosed in the drawings and the other circuits that generate control signals are not limited to the circuit forms disclosed in the embodiment.

The technical concept of the semiconductor device of the present invention may be applied to various semiconductor devices. For example, the present invention may be applied to semiconductor products in general, including functions as CPUs (Central Processing Units), MCUs (Micro Control Units), DSPs (Digital Signal Processors), ASICs (Application Specific Integrated Circuits), ASSPs (Application Specific Standard Products), and memories. Examples of the product types of the semiconductor devices to which the present invention is applicable include an SOC (System On Chip), MCP (Multi Chip Package), and POP (Package On Package). The present invention may be applied to semiconductor devices that have any of such product types and package types.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needless to mention that the present invention embraces the entire disclosure of this specification including the claims, as well as various changes and modifications which can be made by those skilled in the art based on the technical concept of the invention.

What is claimed is:

1. A semiconductor device comprising:
   a memory cell connected to a word line and a bit line;
   a sense amplifier circuit connected to the bit line;
   an access control circuit that controls the word line and the sense amplifier circuit; and
   an internal voltage generating circuit that generates an internal voltage stabilized regardless of fluctuations of an external voltage, wherein
   the access control circuit comprises:
      a first signal generator that operates on the internal voltage and generates a first signal that activates and inactivates the word line;
      a second signal generator that operates on the internal voltage and generates a second signal that activates and inactivates the sense amplifier circuit in synchronization with an activation and an inactivation of the word line;
      a third signal generator that operates on the external voltage and generates a third signal that starts and stops a supply of an overdrive voltage to the sense amplifier circuit in synchronization with the activation of the word line or an activation of the sense amplifier circuit; and
      a fourth signal generator that operates on the internal voltage and generates a fourth signal that inactivates the first signal in synchronization with the activation of the word line or the activation of the sense amplifier circuit,
   the third signal generator determining a period during which the overdrive voltage is to be supplied, in accordance with a level of the external voltage, and
   the fourth signal generator determining timing to activate the fourth signal in accordance with a level of the internal voltage, regardless of the level of the external voltage.

2. The semiconductor device as claimed in claim 1, wherein the third signal generator comprises:

a variable delay element that operates on the external voltage and changes an amount of delay in accordance with the level of the external voltage; and a logic circuit that activates the third signal in synchronization with an activation of the second signal and inactivates the third signal in accordance with an output signal of the variable delay element.

3. The semiconductor device as claimed in claim 2, wherein the fourth signal generator comprises a first fixed delay element having a first amount of delay in accordance with the internal voltage, and the fourth signal generator activating the fourth signal in accordance with an output signal of the first fixed delay element.

4. The semiconductor device as claimed in claim 3, wherein the second signal generator comprises a second fixed delay element having a second amount of delay in accordance with the internal voltage, and the second signal generator activating the second signal in accordance with an output signal of the second fixed delay element.

5. The semiconductor device as claimed in claim 4, wherein the variable delay element in the third signal generator has an input node coupled to one of a first signal line that transmits the first signal and a second signal line that transmits the second signal, and the first fixed delay element in the fourth signal generator has an input node coupled to one of the first signal line and the second signal line.

6. The semiconductor device as claimed in claim 5, wherein the input node of the variable delay element in the third signal generator is coupled to the second signal line, the input node of the first fixed delay element in the fourth signal generator is coupled to the second signal line, and the second fixed delay element in the second signal generator comprises:
  a third fixed delay element having a third amount of delay in accordance with the internal voltage;
  a fourth fixed delay element having a fourth amount of delay in accordance with the internal voltage, the fourth fixed delay element being supplied with an output signal of the third fixed delay element; and
  a first selector that has a first input node supplied with the output signal of the third fixed delay element and a second input node supplied with an output signal of the fourth fixed delay element, the first selector selecting one of the output signals of the third and fourth fixed delay elements, and outputs as the output signal of second fixed delay element.

7. The semiconductor device as claimed in claim 6, further comprising:

an external data terminal that outputs information stored in the memory cell to outside via the sense amplifier circuit and a data output circuit; and a refresh command generating circuit that generates a refresh mode signal to activate the first signal, the refresh mode signal being generated in response to a refresh command issued from the outside to cause the sense amplifier circuit to amplify the information stored in the memory cell and to prevent the external data terminal from outputting the information via the data output circuit, wherein the first selector selects the output signal of the fourth fixed delay elements in response to the refresh mode signal.

8. The semiconductor device as claimed in claim 7, wherein the first fixed delay element in the fourth signal generator comprises:

a fifth fixed delay element having a fifth amount of delay in accordance with the internal voltage;

a sixth fixed delay element having a sixth amount of delay in accordance with the internal voltage, the sixth fixed delay element being supplied with an output signal of the fifth fixed delay element; and a second selector that has a first input node supplied with the output signal of the fifth fixed delay element and a second input node supplied with an output signal of the sixth fixed delay element, the second selector selecting one of the output signals of the fifth and sixth fixed delay elements, and outputs as the output signal of first fixed delay element.

9. The semiconductor device as claimed in claim 8, wherein the second selector selects the output signal of the fifth fixed delay elements in response to the refresh mode signal.

10. The semiconductor device as claimed in claim 9, wherein the refresh command generating circuit further generates a self-refresh mode signal in response to a self-refresh command issued from the outside, the refresh command generating circuit includes a refresh timer that generates a request signal at predetermined intervals, the refresh command generating circuit activates the first signal in accordance with the request signal, and the second selector receives the refresh mode signal and the self-refresh mode signal, selects the output signal of the fifth fixed delay element in response to the refresh mode signal, and selects the output signal of the sixth fixed delay element in response to the self-refresh mode signal.

11. The semiconductor device as claimed in claim 5, wherein the input node of the first fixed delay element in the fourth signal generator is coupled to the first signal line, and the second fixed delay element in the second signal generator comprises:
  a third fixed delay element having a third amount of delay in accordance with the internal voltage;
  a fourth fixed delay element having a fourth amount of delay in accordance with the internal voltage, the fourth fixed delay element being supplied with an output signal of the third fixed delay element; and
  a first selector that has a first input node supplied with the output signal of the third fixed delay element and a second input node supplied with an output signal of the fourth fixed delay element, the first selector selecting one of the output signals of the third and fourth fixed delay elements, and outputs as the output signal of second fixed delay element.

12. The semiconductor device as claimed in claim 11, further comprising:

an external data terminal that outputs information stored in the memory cell to outside via the sense amplifier circuit and a data output circuit; and a refresh command generating circuit that generates a refresh mode signal in response to a refresh command issued from the outside to cause the sense amplifier circuit to amplify the information stored in the memory cell and to prevent the external data terminal from outputting the information via the data output circuit, wherein the first selector selects the output signal of the fourth fixed delay elements in response to the refresh mode signal, and the fourth signal generator controls the fourth signal so that an output timing of the fourth signal is fixed regardless of an output timing of the second signal from the first selector.

13. The semiconductor device as claimed in claim 7, wherein a plurality of the word lines are provided, a plurality of the bit lines are provided, a plurality of the memory cells each connected to an associated one of the word lines and an associated one of the bit lines are provided, a plurality of the sense amplifier circuits each connected to an associated one or ones of the bit lines are provided, the access control circuit controls the word lines and the sense amplifier circuits, and the refresh command generating circuit activates a plurality of the first signals each corresponding to one or ones of the word lines in time series in response to the refresh command.

14. The semiconductor device as claimed in claim 10, wherein a plurality of the word lines are provided, a plurality of the bit lines are provided, a plurality of the memory cells each connected to an associated one of the word lines and an associated one of the bit lines are provided, a plurality of the sense amplifier circuits each connected to an associated one or ones of the bit lines are provided, the access control circuit controls the word lines and the sense amplifier circuits, and the refresh command generating circuit activates a plurality of the first signals each corresponding to one or ones of the word lines in time series in response to the request signal.

15. The semiconductor device as claimed in claim 13, further comprising:

a plurality of memory banks each including a plurality of the memory cells, a plurality of the word lines, and a plurality of the sense amplifiers, wherein the access control circuit controls the plurality of word lines and the plurality of sense amplifier circuits belonging to each of the memory banks, and the refresh command generating circuit activates a plurality of the word lines included in the plurality of memory banks in response to the refresh command and the first signal.

16. The semiconductor device as claimed in claim 14, further comprising a plurality of memory banks each including a plurality of the memory cells, a plurality of the word lines, and a plurality of the sense amplifiers, wherein the access control circuit controls the plurality of word lines and the plurality of sense amplifier circuits belonging to each of the memory banks, and the refresh command generating circuit activates a plurality of the word lines included in the plurality of memory banks in response to the refresh command and the first signal.

17. A method of controlling a semiconductor device, comprising:

activating a first signal to activate a word line connected to a memory cell;

activating a second signal to activate a sense amplifier that amplify information stored in the memory cell, the second signal being activated at a first delay time after activating the first signal;

activating a third signal to start a supply of an overdrive voltage to a high-potential power supply node of the sense amplifier, the third signal being activated at the first delay time after activating the first signal;

inactivating the third signal at a second delay time after activating one of the first and second signals; and activating a fourth signal to inactivate the word line, the fourth signal being activated at a third delay time after activating one of the first and second signals, wherein a first period from an activation of the third signal to an inactivation of the third signal depends on a level of an external voltage supplied to the semiconductor device, and the first delay time and the third delay time depend on an internal voltage not depending on the external voltage, the first delay time and the third delay time being independent of the external voltage, the first delay time and the third delay time not varying with fluctuations of the first period.

18. The method as claimed in claim 17, wherein the third delay time is set as a first fundamental amount of delay both in a normal access operation to output data amplified by the sense amplifier to outside of the semiconductor device and in a refreshing operation not to output the data to the outside of the semiconductor device.

19. The method as claimed in claim 18, wherein the first delay time is set as a second fundamental amount of delay in the normal access operation, and is set as an amount of delay obtained by adding a third fundamental amount of delay to the second fundamental amount of delay in the refreshing operation, and the third delay time is set as the first fundamental amount of delay by adding the third fundamental amount of delay to second signals in the normal access operation, and is set as the first fundamental amount of delay by without adding the third fundamental amount of delay to the second signals in the refreshing operation.

20. The method as claimed in claim 17, wherein the first delay time is set as a fourth fundamental amount of delay in a normal access operation to output data amplified by the sense amplifier to outside of the semiconductor device, and is set as an amount of delay obtained by adding a fifth fundamental amount of delay to the fourth fundamental amount of delay in a refreshing operation not to output the data to the outside of the semiconductor device.

21. The method as claimed in claim 20, wherein the third delay time is set as a sixth fundamental amount of delay in the normal access operation, and is set as an amount of delay obtained by subtracting the fifth fundamental amount of delay from the sixth fundamental amount of delay in the refreshing operation.

22. The method as claimed in claim 17, wherein the fourth signal inactivates the first signal.

* * * * *